(12) United States Patent
D'Addona et al.

(10) Patent No.: US 7,675,325 B2
(45) Date of Patent: Mar. 9, 2010

(54) GTL BACKPLANE BUS WITH IMPROVED RELIABILITY

(75) Inventors: Tony D'Addona, Stittsville (CA); Eric Doyon, Gatineau (CA); Thuan Vu, Ottawa (CA)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 12/114,463

(22) Filed: May 2, 2008

(65) Prior Publication Data

US 2009/0273369 A1 Nov. 5, 2009

(51) Int. Cl.
*H03K 19/0185* (2006.01)
(52) U.S. Cl. .......................................... 326/86; 326/57
(58) Field of Classification Search .................... 326/86
See application file for complete search history.

(56) References Cited

U.S. PATENT DOCUMENTS

| 4,697,858 | A | * | 10/1987 | Balakrishnan | ................ | 439/61 |
|---|---|---|---|---|---|---|
| 5,247,207 | A | | 9/1993 | Wert et al. | | |
| 5,371,424 | A | | 12/1994 | Quigley et al. | | |
| 5,408,146 | A | * | 4/1995 | Nguyen et al. | ................. | 326/86 |
| 5,483,110 | A | * | 1/1996 | Koide et al. | .................. | 307/147 |
| 5,568,060 | A | | 10/1996 | Bartholomay et al. | | |
| 5,852,372 | A | | 12/1998 | Boeckmann et al. | | |
| 6,222,389 | B1 | * | 4/2001 | Williams | ...................... | 326/86 |
| 6,249,142 | B1 | * | 6/2001 | Hall et al. | ...................... | 326/30 |

FOREIGN PATENT DOCUMENTS

WO       WO 00/75796       12/2000

* cited by examiner

*Primary Examiner*—Vibol Tan
(74) *Attorney, Agent, or Firm*—Kramer & Amado, PC

(57) ABSTRACT

Isolation components such as p-n junction or Schottky diodes are provided at pull-up resistors of each signal line of a Gunning Transceiver Logic (GTL) backplane bus in an electronic system for improved reliability, specifically to prevent momentary termination of the bus to ground when a circuit card incorporating the pull-up resistors is inserted into the system.

15 Claims, 2 Drawing Sheets

GTL BACKPLANE BUS WITH IMPROVED RELIABILITY

FIELD OF THE INVENTION

The present invention is directed to communications systems such as data communications and telecommunications switching systems, although it is not limited thereto. In particular, the present invention is directed to a Gunning Transceiver Logic (GTL) backplane bus for such systems.

BACKGROUND OF THE INVENTION

Communications systems, and in general many other types of electronic systems, rely on a backplane based architecture comprising a plurality of circuit cards that plug into, or are otherwise electrically connected to, a system backplane. The system backplane is a facility over which the circuit cards can communicate with each other and over which power is supplied to the circuit cards. Examples of the type circuit cards included in communications systems include switch fabric cards, control cards, input/output (I/O) cards, line cards, and processor cards. Due to the need for high fault tolerance in such systems, also referred to as high availability, one or more of these types of circuit cards may be replicated in the system for redundancy.

A system backplane includes a backplane bus for inter communication between the circuit cards. A backplane bus commonly used for high speed systems is a Gunning Transceiver Logic (GTL) type bus. A GTL bus includes an open drain MOSFET transmitter circuit for each bit or signal line of the bus and one or more respective receiver circuits. A transmitter and receiver circuit may be included in one device thereby forming a GTL transceiver. The GTL bus has a low voltage swing, typically 0.8 volts, resulting in good performance at high data rates, low power consumption and minimal crosstalk between bus signals. Each bit line of a GTL bus is terminated to a termination voltage Vtt through a termination resistor Rtt, which is typically about 50 ohms. The termination voltage Vtt is typically 1.2 volts, although a newer version of the GTL specifications, GTL+, specifies a termination voltage of 1.5 volts. Herein after, the term GTL includes all such versions of the GTL buses unless stated otherwise. Additional details regarding GTL circuits and transceivers may be found by referring to U.S. Pat. No. 5,023,488 to Gunning et al.

In the case of redundant systems, the transmitter of a GTL bus may be replicated on another circuit card for higher system reliability. FIG. 1 depicts such a redundant GTL backplane bus as known in the prior art. Referring to FIG. 1, a redundant GTL backplane bus 10 includes a pair of termination cards 12, 14 labeled termination card A and B, that are both capable of driving electrical signals onto backplane connections 16 of the bus 10. However, only one of the termination cards 12, 14 drives the bus at any given time, that card being designated as an active card of the pair of termination cards, while the other termination card 12, 14 remains in a standby mode and is designated as an inactive card of the pair. The termination card A 12 has a plurality of GTL transmitters 18 each of which is connected to one of the backplane connections 16. Additionally, each of the GTL transmitters 18 is coupled at its output to a positive termination voltage $Vtt_A$ via a corresponding one of a plurality of pull-up resistors 20. The positive termination voltage $Vtt_A$ is generated locally on the termination card A by a low dropout (LDO) voltage regulator 22. Likewise, the termination card B 14 includes a plurality of GTL transmitters 24 each of which is connected to one of the backplane connections 16. Additionally, each of the GTL transmitters 24 on the termination card B is coupled at its output to a positive termination voltage $Vtt_B$ via a corresponding one of a plurality of pull-up resistors 26. The positive termination voltage $Vtt_B$ is generated locally on the termination card B by a low dropout (LDO) voltage regulator 28. The positive termination voltages $Vtt_A$ and $Vtt_B$ are intended to be equal in value, and are also referred to herein as Vtt when specificity to a particular termination card A or B is not required.

The redundant GTL backplane bus 10 may experience a problem if either one of termination cards A or B 12, 14 experiences an open or short circuit failure during normal operation. For example, if either one of the LDO voltage regulators 22, 28 or their associated components failed such that one of the termination voltages $Vtt_A$ or VttB was at ground potential. In that case, rather than having a bus terminated to equal positive termination voltages $Vtt_A$ and $Vtt_B$ via parallel termination at both ends of the backplane connections 16, each end would be terminated to a different voltage. This would likely cause the voltage levels on the bus 10 to be too low for successful data communications over the bus 10.

The type of failure just described with respect to the positive termination voltages $Vtt_A$ and $Vtt_B$ could be caused by various conditions such as component shorts/opens due to component aging or general malfunction of the card. However, another cause of particular concern is insertion of the inactive termination card. When the inactive termination card is inserted, a brief period of time passes before the LDO voltage regulator of that card can provide the termination voltage Vtt at its operational level. During this period of time, the operational effect is the same as having a termination voltage Vtt failure, and consequently the GTL backplane bus 10 is unable to reliably carry data communications between the various circuit cards of the system.

In view of the foregoing, it would be desirable to provide some means of protecting the operation of the GTL backplane bus against failures of either of the termination cards A or B, particularly with respect to the supply of the positive termination voltage Vtt.

SUMMARY OF THE INVENTION

It is an object of the present invention to provide a GTL backplane bus having improved reliability over those known in the art, particularly with respect to supply of the positive termination voltage Vtt.

Embodiments of the invention include an isolation component series coupled in a respective circuit path between a backplane connection and a termination voltage source in a manner so as to prevent current flow from the backplane connection to the termination voltage source. Hereinafter the term coupled is used in reference to a connection between a first component and a second component where the connection is not necessarily direct in that a third component could be in present in the connection between the two components. Otherwise, where the connection is intended to be a direct one the term connected is used. An advantage of the manner of the coupling of the isolation component is that it provides fault isolation between the backplane connection and the termination voltage source when the latter is shorted or otherwise driven to ground potential.

Some embodiments of the invention include a plurality of isolation components each one of which is serially coupled in a respective circuit path between a respective backplane connection of a plurality of backplane connections and the termination voltage source. An advantage of having each isolation component coupled in a respective path, i.e. its own unique or solitary path, between the backplane connection and the termination voltage is that this coupling arrangement provides fault isolation between bit lines of the GTL bus.

According to an aspect of the invention a GTL backplane bus is provided. The GTL backplane bus includes a plurality of backplane connections and a first termination card. The first termination circuit card includes a first termination voltage source; and a plurality of isolation components each one of which is serially coupled in a respective circuit path between a respective one of the backplane connections and the first termination voltage source in a manner so as to prevent current flow from the respective backplane connection to the first termination voltage source.

According to another aspect of the invention a circuit card for a GTL backplane bus is provided. The circuit card includes a termination voltage source; a connector having a plurality of connection terminals each one of which is for connecting to a respective backplane connection of the GTL backplane bus; a plurality of GTL transmitters each one of which is coupled to a respective connection terminal of the connector; and a plurality of isolation components each one of which is serially connected in a respective circuit path between a respective one of the GTL transmitters and the termination voltage source in a manner so as to prevent current flow from the respective backplane connection to the termination voltage source.

According to still another aspect of the present invention a termination circuit card for a GTL backplane bus is provided. The termination circuit card includes: a termination voltage source; a connector having a plurality of connection terminals each one of which is for connecting to a respective backplane connection of the GTL backplane bus; and a plurality of isolation components each one of which is serially connected in a respective circuit path between a respective one of the connection terminals and the termination voltage source in a manner so as to prevent current flow from the respective backplane connection to the termination voltage source.

According to still another aspect of the present invention a GTL transceiver module for a GTL backplane bus having a plurality of bit lines is provided. The GTL transceiver module includes: an input for connecting to a termination voltage source; an input/output port for connecting to one bit line of the plurality of bit lines; a GTL transmitter for driving an electrical signal onto the one bit line; a GTL receiver for receiving electrical signals from the one bit line; and an isolation component connected between the input/output port and the input in a manner so as to prevent current flow from the input/output port to the input.

Advantageously, embodiments of the invention could be used in a system having a GTL backplane bus for improved reliability of operation of the bus, especially with respect to failures or other actions that could affect bus termination voltages such as insertion of circuit cards that supply such voltages.

BRIEF DESCRIPTION OF THE DRAWINGS

The foregoing and other objects, features and advantages of the invention will be apparent from the following more particular description of the preferred embodiments, as illustrated in the appended drawings, where.

In the figures like features are denoted by like reference characters.

DETAILED DESCRIPTION

Figure 1:
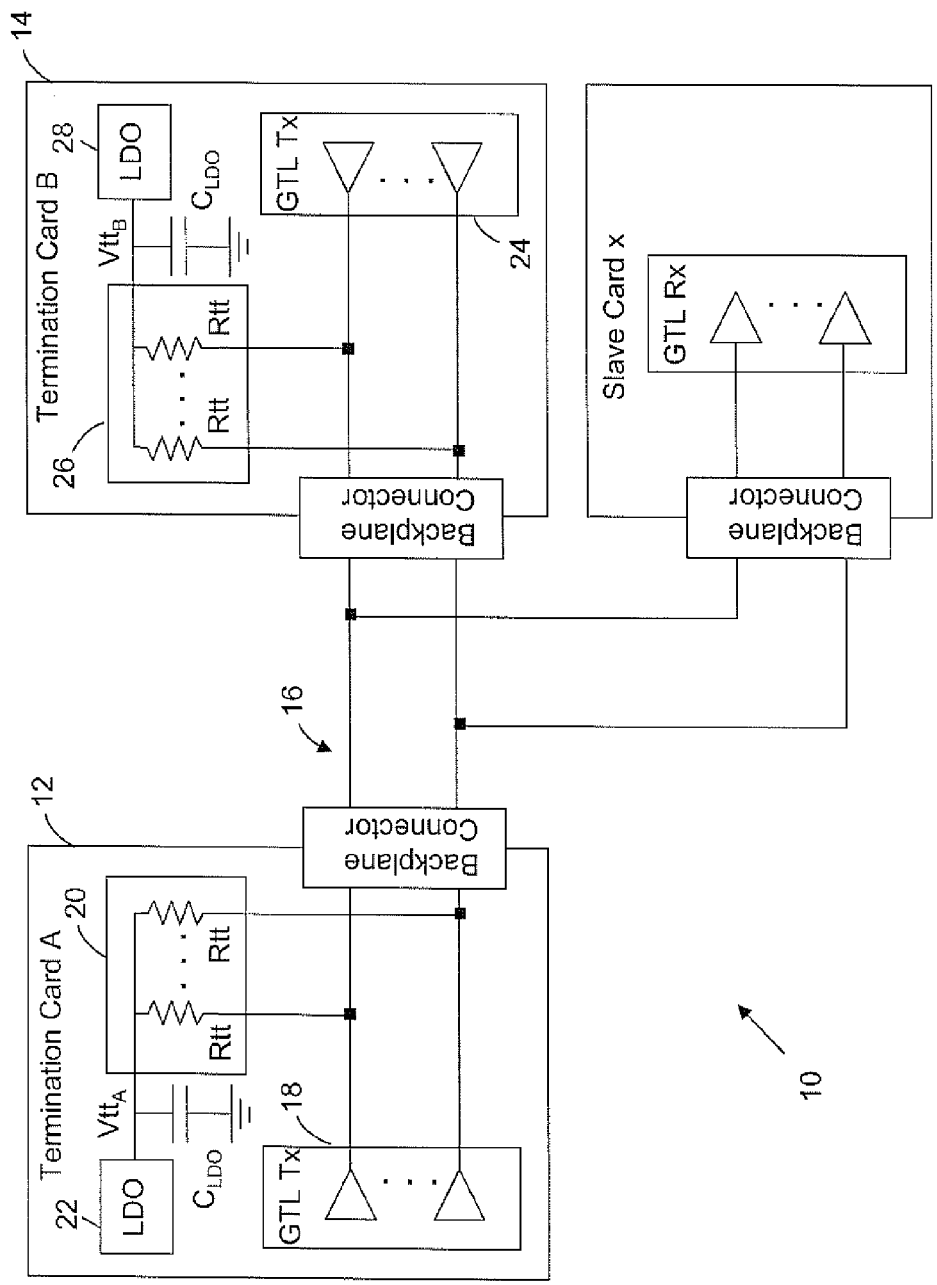
FIG. 1 schematically depicts a redundant GTL backplane bus of the prior art.
Figure 2:
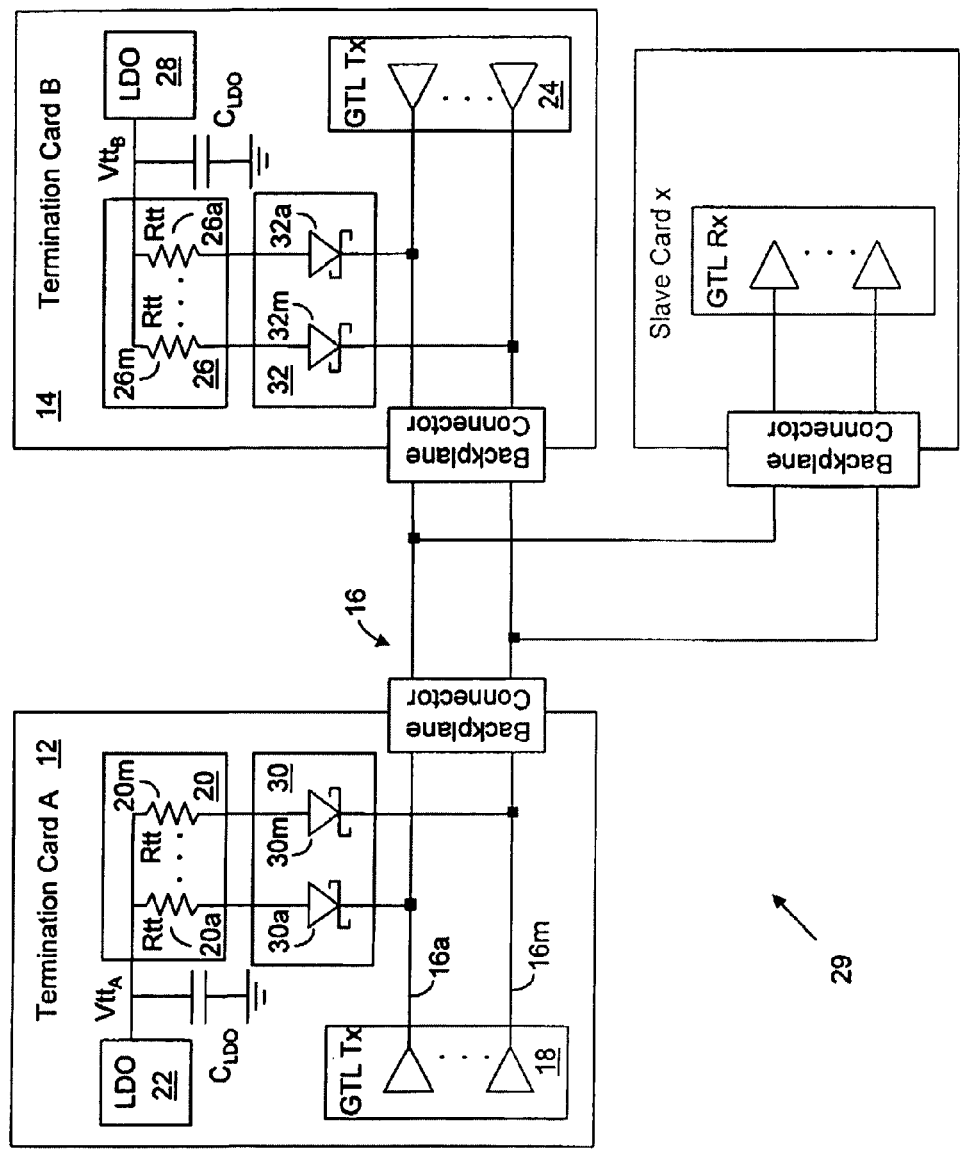
FIG. 2 schematically depicts a redundant GTL backplane bus in accordance with an embodiment of the present invention.

Referring to FIG. 2, an improved redundant GTL backplane bus 29 in accordance with an embodiment of the invention includes a plurality of isolation components 30 each one of which is connected in series between a respective one of the backplane connections 16 and a corresponding one of the termination resistors 20 of the termination card A 12. Similarly, the termination card B 14 includes a plurality of isolation components 32 each one of which is connected in series between a respective one of the backplane connections 16 and a corresponding one of the termination resistors 26 of the termination card B 14.

More specifically, when there are a number m of backplane connections 16a to 16m there are the same number m of isolation components 30a to 30m, which are shown here as Schottky diodes, however use of alternative types of isolation components is possible as will be described later. Each one of the isolation components 30a to 30m is series connected in a circuit path unique to a respective backplane connection 16a to 16m between that backplane connection 16a to 16m and a common termination voltage $Vtt_A$ generated locally on the termination card A 12. Each such circuit path is unique to a particular backplane connection 16a to 16m in that it is a solitary path for current to flow from the common termination voltage $Vtt_A$ to the particular backplane connection 16a to 16m. The unique circuit path aspect of this connection arrangement provides fault isolation between the backplane connections 16a to 16m. The termination card A 12 also includes a number m of termination resistors 20a to 20m, each one of which having a typical value of 50 ohms and being connected to the common termination voltage $Vtt_A$ and a respective isolation component 20a to 20m. For example, termination resistor 20a is connected between the termination voltage $Vtt_A$ and the anode of isolation component 30a, which in this case is a Schottky diode. The cathode of the isolation component 30a is connected to the backplane connection 16a of the termination card A 12. It should be noted that the positioning of any one of the isolation components 30a to 30m relative to its respective termination resistor 20a to 20m could be interchanged without appreciably affecting the operation of the bus 29. For example, the termination resistor 20a could be connected between the backplane connection 16a and the cathode of isolation component 30a, with the anode of the isolation component 30a connected to the termination voltage $Vtt_A$.

The termination card B 14 has the same configuration as the termination card A 12 wherein there is a number m of termination resistors 26a to 26m, each one of which is connected between a common termination voltage $Vtt_B$ and an anode of a respective isolation component 32a to 32m. The cathode of each of the isolation components 32a to 32m is connected to a respective backplane connection 16a to 16m of the termination card B 14.

In operation with termination card A 12 active, if the LDO voltage regulator 28 of the termination card B 14 fails causing $Vtt_B$ to drop to zero volts, or at least below a minimum operational voltage, the isolation components 32 will block current flowing into the termination resistors 26 of the termination card B 14. Without this protection preventing such current flow, logic high voltage levels on the backplane connections 16 would drop below threshold values resulting in failed data communications over the bus 29. Likewise when termination card B 14 is active, a similar failure of LDO voltage regulator 22 of termination card A 12 is protected from affecting operation of the bus 29 by isolation components 30. As well as protecting against failures of the LDO voltage regulator and associated components on the inactive termination, the invention also provides protection against a momentary voltage drop of the termination voltage Vtt when the inactive termination card is inserted into the system. The minimum operational voltage of the termination voltage Vtt is at least no lower than a voltage which causes errors in data communications over the bus 29.

Numerous modifications and adaptations may be made to the embodiment of the invention described above without departing from the scope of the invention, which is defined in the claims. For example, any GTL transmitter or any of the plurality of GTL transmitters could be replaced by a GTL transceiver or a plurality of GTL transceivers, respectively. A GTL transceiver comprises a GTL transmitter and a GTL receiver, and provides to a circuit card having said transceivers with the capability of communicating over the GTL backplane bus in a bidirectional manner. Multiple GTL transceivers could be implemented in one integrated circuit or other type of module. Alternatively, any of the plurality of GTL transmitters could be implemented on one module. Additionally, a circuit card may be augmented with one or more GTL receivers, some or all of which being either in discrete form or implemented in a module. A circuit card may have no capability to drive electrical signals onto the GTL backplane bus, but instead may only have capability to receive such signals, via one or more GTL receivers, and in which case the circuit card may be referred to as a slave card. A circuit card may not have any GTL transmission or GTL receiving capabilities, but instead only provide termination of backplane connections of a GTL backplane bus to a termination voltage source.

Adaptations include replacing any of the Schottky diodes in the described embodiment with a p-n junction silicon or germanium diode. Other adaptations include replacing any of the Schottky diodes with any one of: a collector-base shunted NPN bipolar transistor, an collector-base shunted PNP bipolar transistor, or a drain-gate shunted PMOS or NMOS field effect transistor connected so as to block current flow from a corresponding backplane connection when the termination voltage Vtt of the termination card of the isolation component in question drops below an minimum operational voltage.

It should now be apparent that the described embodiment, modifications, and adaptations provide an advantage over existing redundant GTL backplane buses by removing a single point of failure with respect to the termination voltage of the inactive termination card in a redundant system.

What is claimed is:

1. A Gunning Transceiver Logic (GTL) backplane bus comprising:
  a plurality of backplane connections; and
  a first termination card comprising:
    a first termination voltage source;
    a plurality of isolation components each one of which is serially coupled in a respective circuit path between a respective one of the backplane connections and the first termination voltage source in a manner so as to prevent current flow from the respective backplane connection to the first termination voltage source; and
    a plurality of termination resistors each one of which is serially connected with a given isolation component of the plurality of isolation components in the respective circuit path of the isolation component.

2. The GTL backplane bus of claim 1, wherein the first termination card further comprises a plurality of GTL transmitters for driving electrical signals onto the plurality of backplane connections, and wherein each GTL transmitter is coupled to a respective backplane connection.

3. The GTL backplane bus of claim 2, wherein the first termination card further comprises, for at least one GTL transmitter, a respective GTL receiver coupled thereto at an output of the GTL transmitter for receiving electrical signals from the GTL backplane bus and communicating them to one or more other components of the first termination card.

4. The GTL backplane bus of claim 3, wherein the GTL transmitter and the GTL receiver are part of a GTL transceiver module.

5. The GTL backplane bus of claim 4, wherein the GTL transceiver module comprises at least one isolation component of the plurality of isolation components.

6. The GTL backplane bus of claim 1, further comprising:
  a second termination card for driving electrical signals onto the plurality of backplane connections, the second termination card comprising:
    a second termination voltage source; and
    a plurality of isolation components each one of which is serially coupled in a respective circuit path between a respective one of the backplane connections and the second termination voltage source of the second termination card in a manner so as to prevent current flow from the respective backplane connection to the second termination voltage source.

7. The GTL backplane bus of claim 1, wherein at least one isolation component comprises any one of: a Schottky diode, a p-n junction silicon diode, or a p-n junction germanium diode.

8. The GTL backplane bus of claim 6, wherein at least one isolation component of the first termination card comprises any one of: a Schottky diode, a p-n junction silicon diode, or a p-n junction germanium diode.

9. The GTL backplane bus of claim 8, wherein at least one isolation component of the second termination card comprises any one of: a Schottky diode, a p-n junction silicon diode, or a p-n junction germanium diode.

10. A circuit card for a GTL backplane bus, the circuit card comprising:
  a termination voltage source;
  a connector having a plurality of connection terminals each one of which is for connecting to a respective backplane connection of the GTL backplane bus;
  a plurality of GTL transmitters each one of which is coupled to a respective connection terminal of the connector; and
  a plurality of isolation components each one of which is serially coupled in a respective circuit path between a respective one of the GTL transmitters and the termination voltage source in a manner so as to prevent current flow from the respective backplane connection to the termination voltage source; and
  a plurality of termination resistors each one of which is serially connected with a given isolation component of the plurality of isolation components in the respective circuit path of the isolation component.

11. The circuit card of claim 10, wherein at least one isolation component comprises any one of: a Schottky diode, a p-n junction silicon diode, or a p-n junction germanium diode.

12. A termination circuit card for a GTL backplane bus, the termination circuit card comprising:
  a termination voltage source;
  a connector having a plurality of connection terminals each one of which is for connecting to a respective backplane connection of the GTL backplane bus;

a plurality of isolation components each one of which is serially coupled in a respective circuit path between a respective one of the connection terminals and the termination voltage source in a manner so as to prevent current flow from the respective backplane connection to the termination voltage source;

a plurality of termination resistors each one of which is serially connected with a given isolation component of the plurality of isolation components in the respective circuit path of the isolation component.

13. The termination circuit card of claim 12, wherein at least one isolation component has a cathode terminal and an anode terminal, and the manner in which the isolation component is coupled is with its cathode terminal coupled to a respective one of the connection terminals and its anode terminal coupled to the termination voltage source.

14. A GTL transceiver module for a GTL backplane bus having a plurality of bit lines, the GTL transceiver module comprising:

an input for coupling to a termination voltage source;

an input/output port for coupling to one bit line of the plurality of bit lines;

a GTL transmitter for driving an electrical signal onto the one bit line;

a GTL receiver for receiving electrical signals from the one bit line;

an isolation component coupled between the input/output port and the input in a manner so as to prevent current flow from the input/output port to the input; and a termination resistor serially connected with the isolation component in a circuit path of the isolation component.

15. The GTL transceiver module of claim 14, wherein the isolation component comprises a drain-gate shunted p-channel or n-channel metal oxide semiconductor field effect transistor.

* * * * *